(12) United States Patent
Chung

(10) Patent No.: US 7,056,382 B2
(45) Date of Patent: Jun. 6, 2006

(54) EXCIMER LASER CRYSTALLIZATION OF AMORPHOUS SILICON FILM

(75) Inventor: Se-Jin Chung, Gyeongsangbuk-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 37 days.

(21) Appl. No.: 10/689,030

(22) Filed: Oct. 21, 2003

(65) Prior Publication Data
US 2004/0060506 A1   Apr. 1, 2004

Related U.S. Application Data

(62) Division of application No. 09/965,844, filed on Oct. 1, 2001, now Pat. No. 6,656,270.

(30) Foreign Application Priority Data
Oct. 2, 2000   (KR)   ............................... 2000-57832

(51) Int. Cl.
   *C30B 25/12*   (2006.01)

(52) U.S. Cl. ..................... 117/89; 117/43; 117/44; 117/84

(58) Field of Classification Search ............... 117/4, 117/43, 44, 89, 84; 438/151
See application file for complete search history.

(56) References Cited

U.S. PATENT DOCUMENTS

| 6,322,625 B1 | 11/2001 | Im |
| 6,392,810 B1 * | 5/2002 | Tanaka ........................ 359/622 |
| 6,558,991 B1 * | 5/2003 | Yamazaki et al. ........... 438/151 |

FOREIGN PATENT DOCUMENTS

| JP | 5-160151 | 6/1993 |
| KR | 1998-0002239 | 8/1999 |

OTHER PUBLICATIONS

Moshe Nazarathy &D.W. Dolfi, "Spread-spectrum nonlinear-optical interactons: quasi-phase matching with pseudo-random polarity reversals", Optics Letters, vol. 12, p. 823, Oct. 1987, pp. 823-825.

Martin M. Fejer, et al., "Quasi-Phase-Matched Second Harmonic Generation: Tuning and Tolerances", IEEE Journal of Quantum Electronics, vol. 28, No. 11, Nov. 1992, pp. 2631-2654.

* cited by examiner

*Primary Examiner*—Felisa Hiteshew
(74) *Attorney, Agent, or Firm*—McKenna Long & Aldridge LLP (57) ABSTRACT

A method of crystallizing an amorphous silicon layer includes the steps of generating an excimer laser beam having a first energy density and a second energy density, irradiating an amorphous silicon layer with at least one exposure of the excimer, wherein the first energy density melts the amorphous silicon layer to a first depth from a surface of the amorphous silicon layer equal to the first thickness and the second energy density melts the amorphous silicon layer to a second depth from the surface of the amorphous silicon layer less than the first thickness.

5 Claims, 6 Drawing Sheets

EXCIMER LASER CRYSTALLIZATION OF AMORPHOUS SILICON FILM

This is a divisional of application Ser. No. 09/965,844, filed on Oct. 1, 2001 U.S. Pat. No. 6,656,270.

This application claims the benefit of Korean Patent Application No. 2000-57832, filed on Oct. 2, 2000 in Korea, which is hereby incorporated by reference.

BACKGROUND OF THE INVENTION

1. Field of the Invention

The present invention relates to a method of crystallizing an amorphous silicon film, and more particularly, to the crystallizing of the amorphous silicon film using an excimer laser.

2. Description of Related Art

Generally, polycrystalline silicon (p-Si) or amorphous silicon (a-Si) are materials used as the active layer of thin film transistor (TFTs) in liquid crystal display (LCD) devices. In contrast to amorphous silicon, polycrystalline silicon provides faster display response time when used as an element of the TFT. However, when using polycrystalline silicon as the active layer of the TFT, a quartz substrate is required because of high temperature processes used to form the TFT, thereby increasing costs. Accordingly, polycrystalline silicon is generally used for small-sized substrates, on the order of 3 or 4 inches. Alternatively, amorphous silicon may be formed under the relatively low temperature processes, and thus, it is used for forming the TFT of a large-sized LCD. However, an image produced on the LCD may flicker because dangling bonds of the amorphous silicon may cause light leakage current when light is irradiated onto the LCD panel. Therefore, it has been proposed that in order to use polycrystalline silicon for the large-sized LCD, amorphous silicon is melted and crystallized.

Polycrystalline silicon is composed of crystal grains and grain boundaries. If the grain boundaries are irregularly distributed within the polycrystalline silicon, the grain boundaries act as barriers to the carriers, thereby degrading carrier mobility. Accordingly, when crystallizing amorphous silicon to form polycrystalline silicon, uniformly large grains need to be formed to reduce the effects caused at the grain boundaries.

One proposed process for crystallizing amorphous silicon utilizes laser heat treatment. The laser heat treatment process involves depositing amorphous silicon onto a substrate and repeatedly irradiating the amorphous silicon with laser energy, thereby forming polycrystalline silicon with uniform grains. One common example of laser heat treatment involves excimer laser crystallizing. The excimer laser usually uses halides such as ArF, KrF or XeCl, for example. Furthermore, the energy density distribution profile of an excimer laser beam is trapezoid-shaped, unlike other laser beams which have a Gaussian energy density distribution profile resembling an isosceles triangle. The characteristic curve of the Gaussian beam is different from the characteristic curve of the excimer laser beam. By passing a laser beam through a beam homogenizer, the Gaussian energy density distribution is transformed into an energy density uniformly distributed across the spatial extent of the beam.

Figure 1:
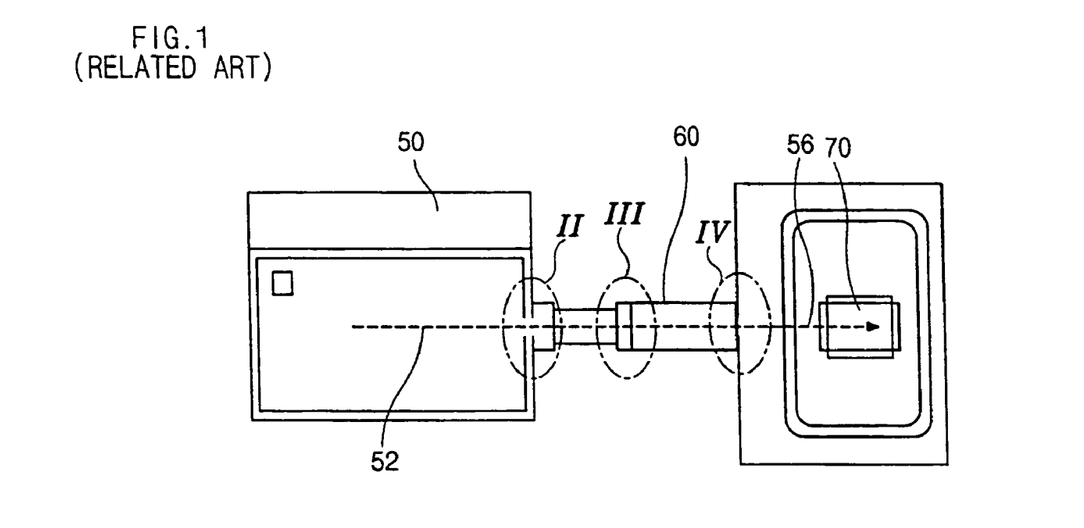
FIG. 1 is a schematic view of an excimer laser apparatus used to crystallize amorphous silicon.
Figure 2:
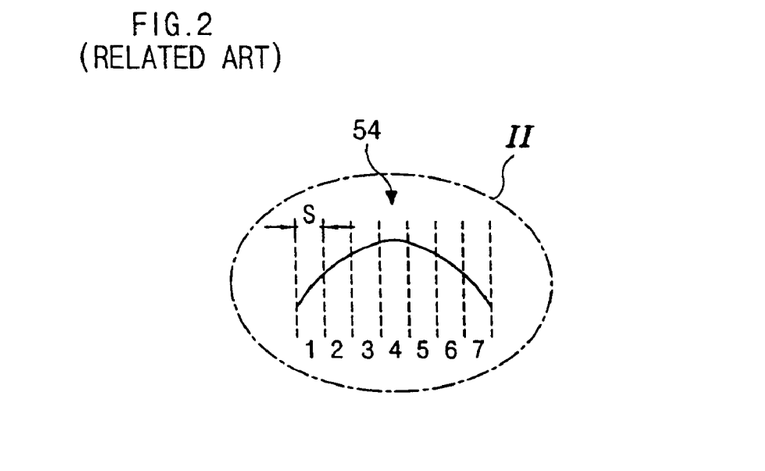
FIG. 2 shows a Gaussian energy density distribution profile of a laser beam generated from a excimer laser generator.
Figure 3:
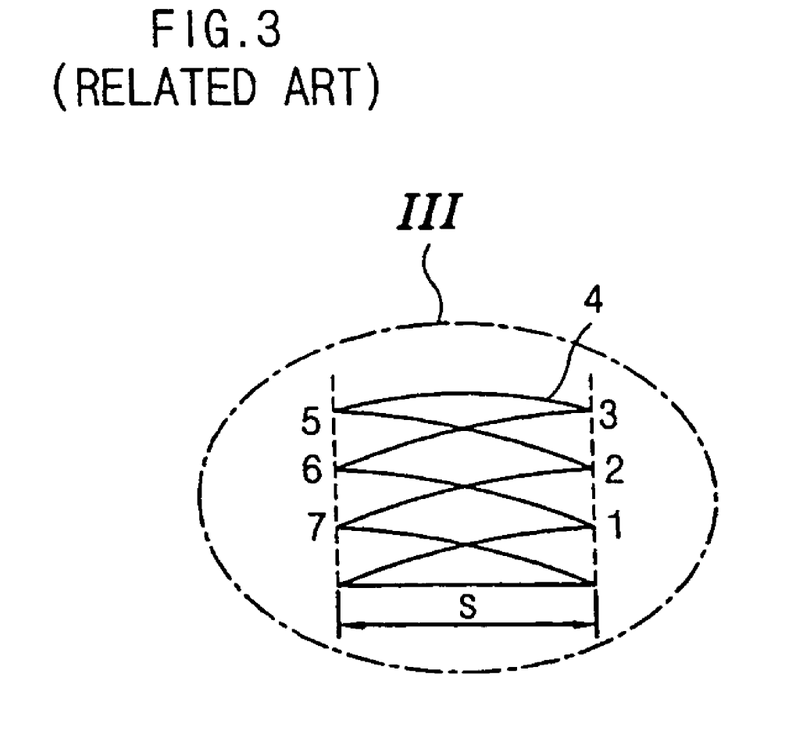
FIG. 3 shows a segment of a laser beam where each of the segments of the laser beam cross.
Figure 4:
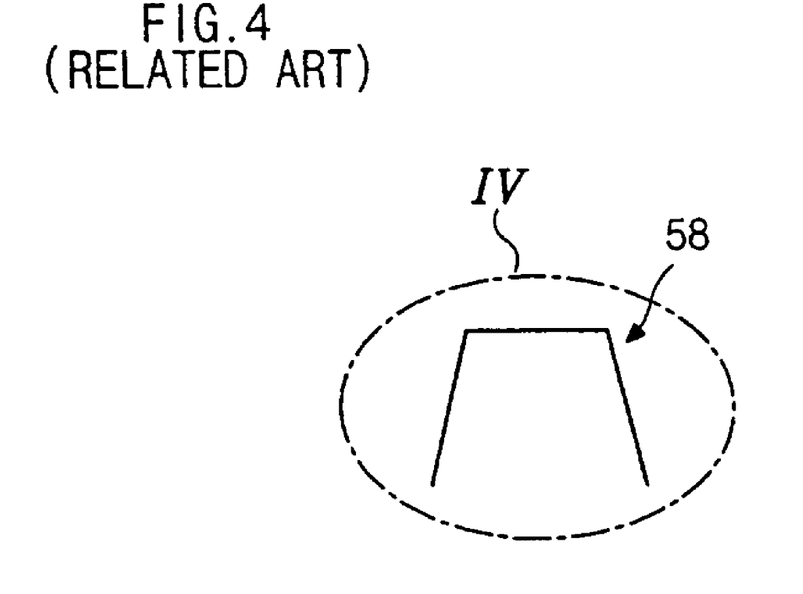
FIG. 4 shows a top hat energy density distribution profile of the laser beam after passing through a beam homogenizer.

FIG. 1 is a schematic view of an excimer laser apparatus that crystallizes amorphous silicon, FIG. 2 shows a Gaussian energy density distribution profile of a laser beam generated from a excimer laser generator, FIG. 3 shows a segment of a laser beam where each of the segments of the laser beam cross, and FIG. 4 shows a top hat distribution profile of the energy density after the laser beam passes through a beam homogenizer.

In FIG. 1, the excimer laser apparatus includes an excimer laser generator 50 and a beam homogenizer 60. A medium for the excimer laser generator 50 is HCl, Ne or/and a mixture thereof. A laser control system (not shown) installed in the excimer laser generator 50 controls energy discharged from the excited electrons and generates a laser beam having a desired energy density. The laser generator 50 emits the laser beam to the beam homogenizer 60. Furthermore, the beam homogenizer 60 transforms a laser beam 52 into a laser beam 56 having a uniform energy density distribution across the spatial extent of the beam, thereby resulting in a top hat energy density distribution profile 58 as shown in FIG. 4.

Before the laser beam 52 passes through the beam homogenizer 60, it has a Gaussian energy density distribution as previously described and shown in FIG. 2. An energy density of the laser beam is a relative maximum within a central portion of the laser beam, thereby forming a Gaussian energy density distribution profile that resembles an isosceles triangle. As the laser beam 52 is divided in seven segments "S" by the beam homogenizer 60, each of the individual segments of the laser beam cross each other in one segment in the beam homogenizer 60. Accordingly, the laser beam 52 is transformed into the laser beam 56 having a top hat energy density distribution profile 58. The beam profile of the laser beam 56 has a trapezoidal shape and is applied to the substrate 70.

Figure 5:
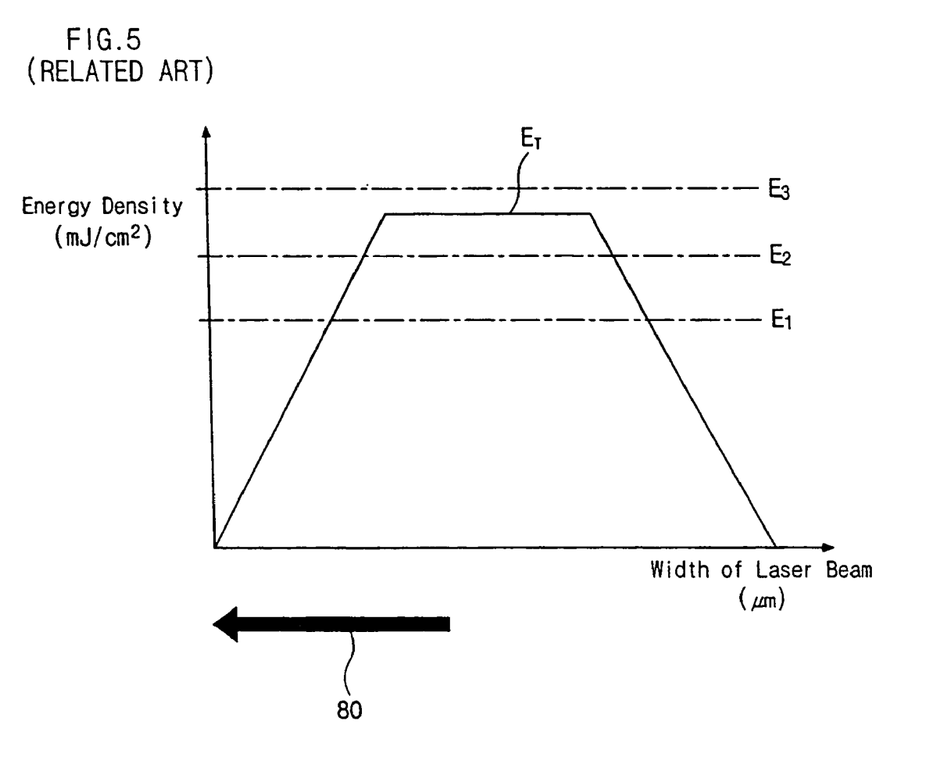
FIG. 5 is a graph showing the energy density of a laser beam having a top hat distribution profile.

FIG. 5 shows the energy density of a laser beam having a top hat distribution profile. In FIG. 5, the x-axis represents a width of the laser beam, while the y-axis represents the energy density of the laser beam. The energy density "$E_T$" is a top hat area of the excimer laser beam and represents an area with a sufficient amount of energy density to melt amorphous silicon. The energy density "$E_T$" is controlled to be between a second energy density "$E_2$" and a third energy density "$E_3$." Further, an arrow 80 disposed below the graph represents a direction in which the excimer laser beam is irradiated onto the surface of the amorphous silicon that is disposed on a substrate. In practice, the substrate moves in a direction opposite to the direction of the arrow 80, and the laser beam crystallizes the amorphous silicon.

Figure 6:
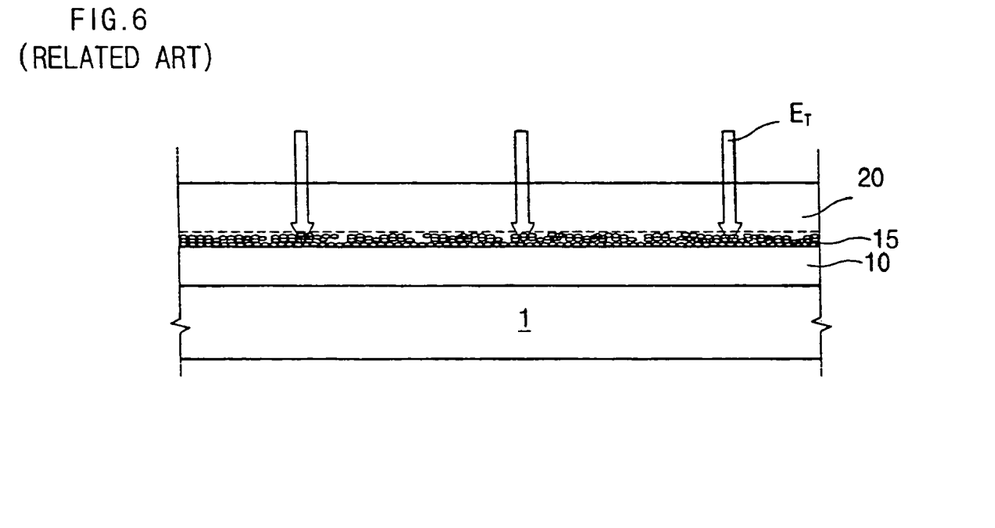
FIG. 6 is a cross-sectional view of a substrate having an amorphous silicon layer that is irradiated by a laser beam.

FIG. 6 is a cross-sectional view of a substrate having an amorphous silicon layer that is irradiated with a laser beam having the top hat energy density distribution profile shown in FIG. 5. In FIG. 6, an insulation layer 10 is disposed on a transparent substrate 1 includes an insulator layer 10 made of silicon nitride ($SiN_x$), for example. An amorphous silicon layer 20 is disposed on the insulation layer 10 with seeds 15 formed in a bottom region of the amorphous silicon layer 20 adjacent to an interface between the insulation layer 10 and the amorphous silicon layer 20. The seeds 15 enhance growth of the grains in the amorphous silicon and are usually formed by hydrogen ($H_2$) gas during a PECVD (Plasma Enhanced Chemical Vapor Deposition) process that sequentially deposits the insulation layer 10 and the amorphous silicon layer 20 onto the substrate 1.

Now referring to FIGS. 5 and 6, the energy density necessary to crystallize the amorphous silicon is divided into three energy densities: a first energy density "$E_1$;" a second energy density "$E_2$;" and, a third energy density "$E_3$." The first energy density "$E_1$" ranges from 200 to 300 mJ/cm$^2$ and melts a surface portion of the amorphous silicon layer 20, thereby forming fine grains having diameters of about 1,000 angstroms (Å). The second energy density "$E_2$" ranges from 310 to 370 mJ/cm² and melts the amorphous silicon layer 20 to the bottom region around the seeds 15 to form large grains. However, since the seeds 15 are irregularly distributed, the large grains are not uniformly formed. The third energy density "$E_3$" is at least 380 mJ/cm² and melts all portions of the amorphous silicon layer 20, thereby forming polycrystalline silicon. During crystallizing by the third energy density "$E_3$," the seeds 15 are re-formed within the polycrystalline silicon layer and the number of the seeds increases, thereby forming fine grains having diameters of 500 angstroms (Å). Accordingly, it is difficult to create large grains using the above-described process since the amorphous silicon is repeatedly crystallized. Furthermore, since the laser beam irradiates only a single portion of the substrate at a time, grains are formed by repeatedly melting and crystallizing the amorphous silicon layer.

However, the laser heating treatment process described above is problematic in that the excimer laser apparatus produces large energy density differences of 15% between subsequent laser beam exposures and the resulting crystallizing of the amorphous silicon has a narrow distribution. Furthermore, in order to overcome these problems, the subsequent laser beam exposures are overlapped in an increasing ratio. Accordingly, since this process lengthens the exposure time and the total number of the exposures, the useful life of the excimer laser apparatus is shortened, thereby decreasing manufacturing yields.

In the conventional art, it is very difficult to create an ideal energy density that can uniformly form the grains due to energy density differences between sequential exposures. Accordingly, the laser irradiation exposure overlaps at an increasing ratio, and the laser irradiation exposure time increases. Further, a large number of lasers is required, thereby increasing the costs maintaining the laser apparatus. However, in the present invention, since the energy density of the laser has a stepped distribution profile and the difference of the energy density is about 10 to 15 mJ/cm² between the first energy density "$E_M$" and the second energy density "$E_S$," the laser beam may be overlapped at a low ratio. Therefore, the number of irradiation exposures and the irradiation exposure time are reduced. Further, the grains have a relatively large uniform size of about 3,000 to 4,000 angstroms (Å). In other words, the laser irradiation exposures are overlapped at the ratio of about 95% and it takes about 120 seconds to crystallize one substrate at the condition of 360 mm scan/300 Hz in the conventional art. However, in the present invention, the overlapping ratio of the laser irradiation exposure is less than 90% and the irradiation exposure time to one substrate is one sixth of the conventional time to one substrate, thereby increasing the throughput of the excimer laser apparatus.

SUMMARY OF THE INVENTION

Accordingly, the present invention is directed to a method of crystallizing an amorphous silicon film using an excimer laser that substantially obviates one or more of problems due to limitations and disadvantages of the related art.

An object of the present invention is to provide a method of crystallizing an amorphous silicon layer into a polycrystalline silicon layer having uniformly large grains.

Another object of the present invention is to provide a method of crystallizing an amorphous silicon layer with increased manufacturing yield.

Another object of the present invention is to provide a system for crystallizing amorphous silicon.

Additional features and advantages of the invention will be set forth in the description which follows, and in part will be apparent from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the present invention, as embodied and broadly described, a method of crystallizing an amorphous silicon layer including the steps of generating an excimer laser beam having a first energy density and a second energy density; irradiating an amorphous silicon layer of a first thickness with at least one exposure of the excimer laser beam, wherein the first energy density melts the amorphous silicon layer to a first depth from a surface of the amorphous silicon layer equal to the first thickness and the second energy density melts the amorphous silicon layer to a second depth from the surface of the amorphous silicon layer less than the first thickness.

In another aspect, an excimer laser system for crystallizing an amorphous silicon layer includes an excimer laser generator that generates an excimer laser beam having a Gaussian energy density profile, a beam homogenizer to transform the excimer laser beam into a laser beam having a stepped energy density distribution profile that includes at least a first energy density and a second energy density, and a filter disposed between the excimer laser generator and the beam homogenizer.

In another aspect, A method for forming a polycrystalline silicon layer includes the steps of forming an insulation layer on a substrate, forming an amorphous silicon layer on the insulation layer, forming seeds in a bottom portion of the amorphous silicon layer adjacent to an interface between the insulation layer and the substrate, and converting the amorphous silicon layer to polycrystalline silicon using an excimer laser beam that includes a stepped energy density distribution profile having substantially flat first and second energy density distribution profiles.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are shown in the accompanying drawings. Wherever possible, the same reference numbers will be used throughout the drawings to refer to the same or like parts.

Figure 7:
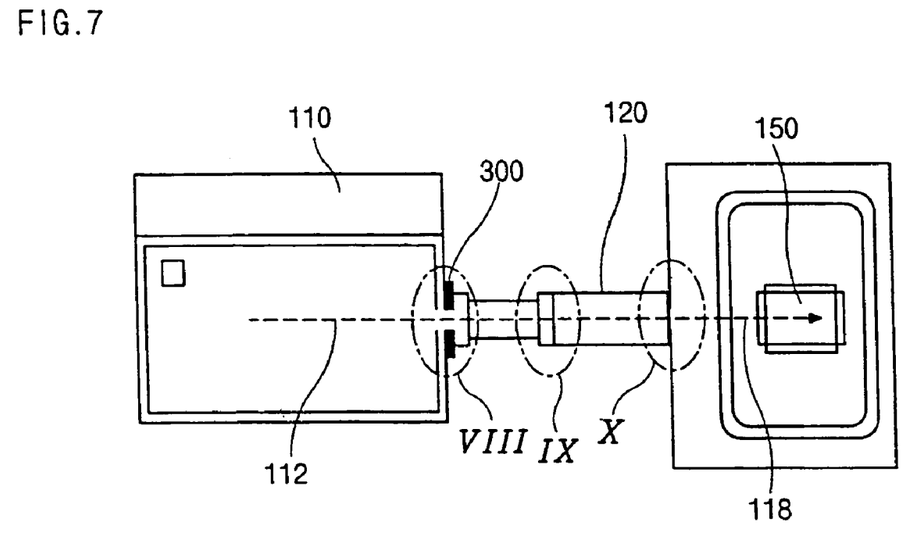
FIG. 7 is a schematic view of an exemplary excimer laser apparatus used to crystallize amorphous silicon according to the present invention.

FIG. 7 shows an excimer laser apparatus including an excimer laser generator 110 and a beam homogenizer 120. A medium for the excimer laser generator 110 may include HCl, Ne or/and a mixture thereof, for example. A laser control system (not shown) may include the excimer laser generator 110 to control energy discharged from excited electrons and to generate a laser beam 112 with an energy density. The laser generator 110 emits the laser beam 112 through the beam homogenizer 120. Furthermore, the beam homogenizer 120 transforms the laser beam 112 into a laser beam 118 having a stepped energy density distribution profile across a spatial extent of the beam. A filter 300 disposed between the excimer laser generator 110 and the beam homogenizer 120.

Figure 8A:
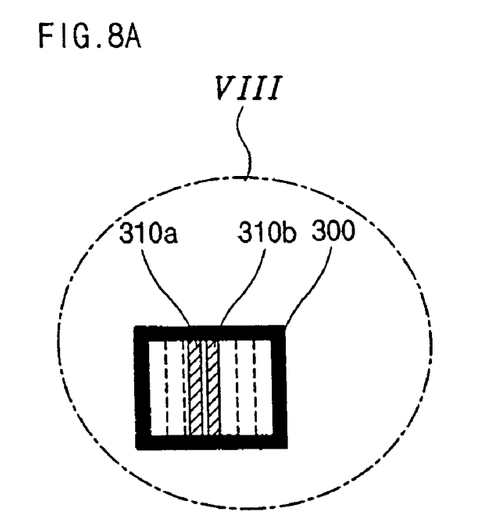
FIG. 8A is an enlarged view at VIII of FIG. 7 of an exemplary filter disposed between an exemplary laser generator and an exemplary beam homogenizer of FIG. 7.
Figure 8B:
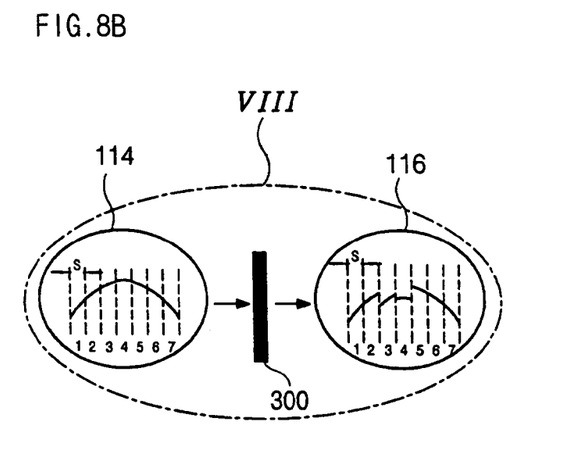
FIG. 8B is an enlarged view at VIII of FIG. 7 that shows laser beam profiles before a laser beam passes through an exemplary filter and after passing through the exemplary filter according to the present invention.

In FIGS. 8A and 8B, the filter 300 may include first and second beam stops 310a and 310b that may be formed of metal lines, for example. A material for forming the first and second beam stops 310a and 310b may include at least a refractory metal, such as nickel (Ni) or/and molybdenum (Mo), for example. The energy density of the laser beam 112 has a normal Gaussian distribution profile 114 prior to passing through the filter 300 and has a relative maximum energy density located at a central portion of the laser beam, thereby resembling an isosceles triangle. However, after the laser beam 112 passes through the filter 300, it is transformed to a laser beam having a modified Gaussian energy density distribution profile 116. Specifically, since the laser beam 112 is divided into seven segments "S" as shown in FIG. 8B, the total energy density profile of the laser beam is not continuous after it passes through the filter 300. Third and fourth segments of the laser beam are changed by the corresponding first and second beam stops 310a and 310b of the filter 300. The energy density distribution profile is disrupted due to the first and second beam stops 310a and 310b of the filter 300.

Figure 9:
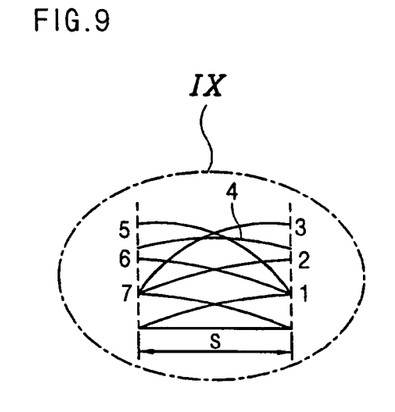
FIG. 9 is an enlarged view at IX of FIG. 7 that shows an exemplary segment of a laser beam where each of the segments of the laser beam cross according to the present invention.
Figure 10:
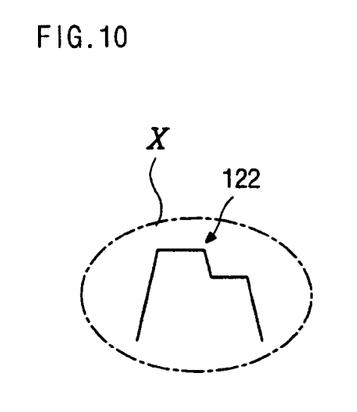
FIG. 10 is an enlarged view at X of FIG. 7 that shows a laser beam profile after passing through the exemplary beam homogenizer of FIG. 7.

Further in the beam homogenizer 120, the laser beam 112 is transformed into the laser beam 118 having the stepped energy density distribution profile 122 of FIG. 10. Moreover, each segment of the laser beam 116 is crossed with each other in the segment of the beam homogenizer 120 as shown in FIG. 9. Thus, the laser beam 112 is transformed into the laser beam 118 with a beam profile of the stepped energy density distribution profile 122 in FIG. 10. The laser beam 118 is directed onto the amorphous silicon layer disposed on the substrate 150. When irradiating the laser beam 118 onto the amorphous silicon layer on the substrate 150, the laser beam irradiation overlaps at a ratio of about 85 to 90%, and it takes about 20 to 25 seconds to crystallize the amorphous silicon (20~25 sec. per one substrate) at a rate of about 360 mm scan/300 Hz. Further, since the laser beam is irradiated only upon one portion of the amorphous silicon layer at a time, the laser beam irradiation will overlap by way of moving the substrate in one direction, thereby forming the grains by repeatedly melting and crystallizing the amorphous silicon.

Figure 11A:
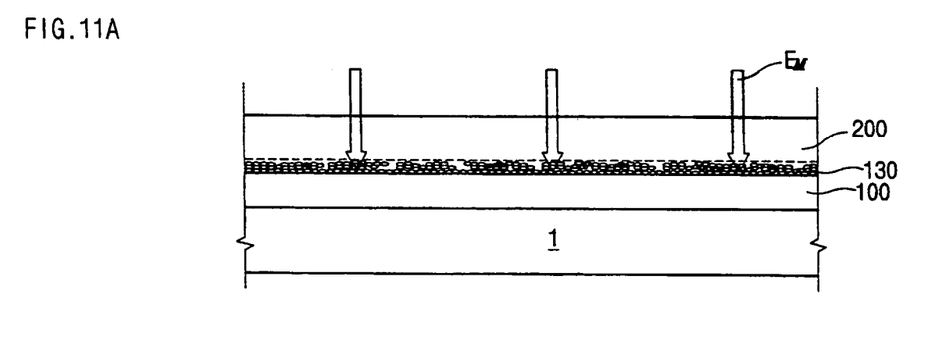
FIGS. 11A and 11B are cross-sectional views of a substrate having an amorphous silicon layer that is irradiated with a laser beam according to the present invention.
Figure 11B:
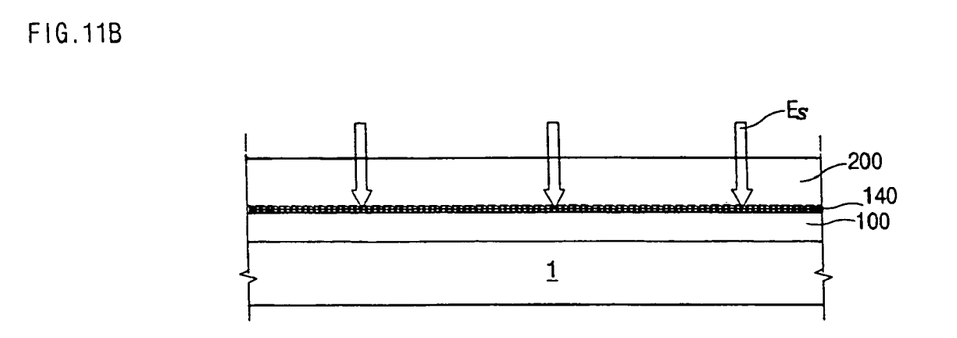
Figure 12:
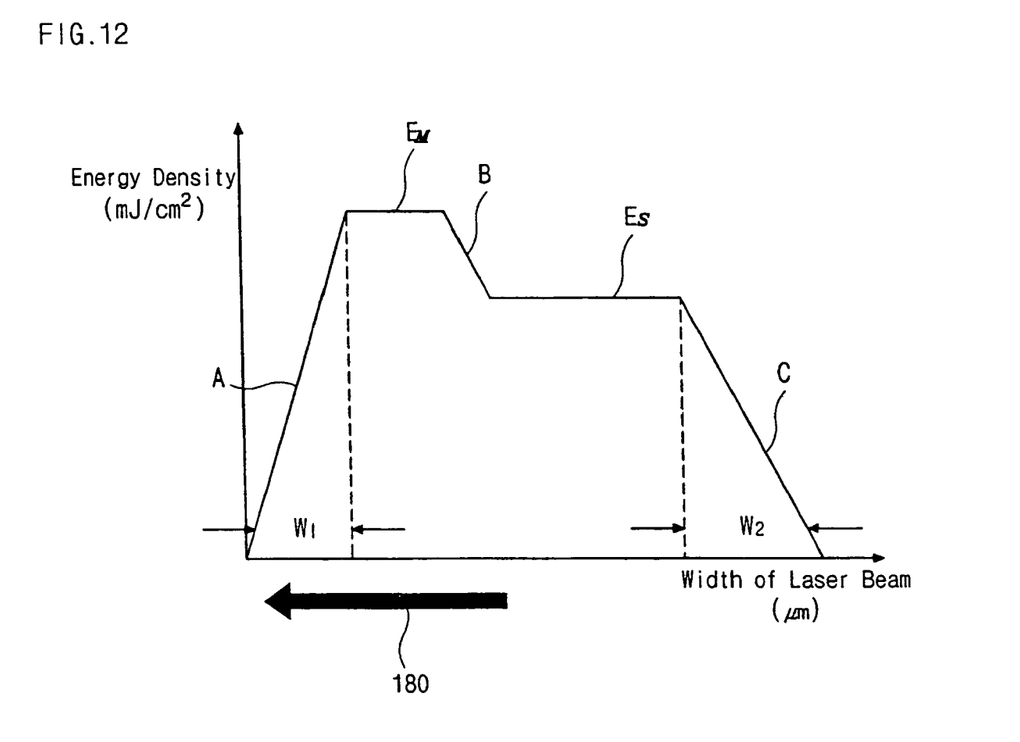
FIG. 12 shows an exemplary energy density diagram of the laser beam according to the present invention.

FIGS. 11A and 11B are cross-sectional views of an amorphous silicon layer disposed on a substrate being irradiated by an exemplary laser beam according to the present invention, and FIG. 12 is an exemplary energy density diagram of a laser beam according to the present invention. Although FIG. 12 shows an exemplary energy density diagram having relatively constant, or flat energy density profile portions "$E_M$" and "$E_S$," these energy density profile portions may be relatively inclined. Likewise, the inclined energy density profile portions "A," "B," and "C" may have relatively different slopes.

In FIG. 11A, an insulation layer 100 may be disposed on a transparent substrate 1, and an amorphous silicon layer 200 may be disposed on the insulation layer 100. Further, seeds 130 may be formed in a bottom portion of the amorphous silicon layer 200 adjacent to an interface between the insulation layer 100 and the amorphous silicon layer 200. The seeds 15 may be formed by hydrogen ($H_2$) gas during a PECVD (Plasma Enhanced Chemical Vapor Deposition) process that sequentially deposits the insulation layer 100 and amorphous silicon layer 200 on the substrate 1.

In FIGS. 11A and 12, when a first energy density "$E_M$" is irradiated onto the amorphous silicon layer 200, the amorphous silicon is melted to a first depth from a surface of the amorphous silicon layer to an interface between the insulation layer 100 and the amorphous silicon layer 200. Accordingly, the seeds 130 disposed in the bottom portion of the amorphous silicon layer 200 are melted by the first laser beam energy "$E_M$." Then, during a first crystallizing step "B" of FIG. 12, the seeds 130 are distributed throughout the amorphous silicon layer.

In FIGS. 11B and 12, a laser beam having a second energy density "$E_S$" is applied to the amorphous silicon layer 200 that has been crystallized via the first crystallizing step "B." Accordingly, a portion of the seeds 130 are removed through a second melting step except for seeds 140 that are disposed adjacent to the interface between the insulation layer 100 and the amorphous silicon layer 200. Then, the amorphous silicon layer 200 and the seeds 140 disposed in the bottom portion of the amorphous silicon layer 200 are again crystallized during a second crystallizing step "C." A width of the laser beam in the second crystallizing step "C" is larger than the related art, thereby causing the seeds 140 adjacent to the interface to grow into large uniform grains. Namely, nuclei are generated inside the amorphous silicon layer 200, and the grains grow laterally during the second crystallizing step "C," thereby uniformly forming large grains. In FIG.

12, a width "$W_1$" of a melting step "A" ranges from about 0 to 100 micrometers (μm) at about 10% of the first energy density "$E_M$," and a width "$W_2$" of the second crystallizing step "C" ranges from about 100 to 300 micrometers (μm) at about 10% of the first energy density "$E_M$." An arrow 180 disposed below the graph represents a direction in which the excimer laser beam is irradiated. Further, an energy density difference between the first energy density "$E_M$" and the second energy density "$E_S$" is about 10 to 15 mJ/cm$^2$—equal to the value for uniformly forming large crystals. Accordingly, the amorphous silicon layer is crystallized into a uniform polycrystalline silicon layer through several melting and crystallizing steps by applying the laser beam having the stepped distribution profile shown in FIG. 12.

It will be apparent to those skilled in the art that various modifications and variations can be made in the method of crystallizing the amorphous silicon without departing from the spirit or scope of the inventions. Thus, it is intended that the present invention cover the modifications and variations of this invention provided they come within the scope of the appended claims and their equivalents.

What is claimed is:

1. An excimer laser system for crystallizing an amorphous silicon layer, comprising;
    an excimer laser generator that generates an excimer laser beam having a Gaussian energy density profile;
    a beam homogenizer to transform the excimer laser beam into a laser beam having a stepped energy density distribution profile that includes at least a first energy density and a second energy density, wherein the first energy density is at least 380 mJ/cm$^2$ and the second energy density ranges from 310 mJ/cm$^2$ to 370 mJ/cm$^2$; and
    a filter disposed between the excimer laser generator and the beam homogenizer.

2. The system according to claim 1, wherein the filter includes at least two beam stops.

3. The system according to claim 2, wherein the beam stops include at least a material selected from a group comprising nickel (Ni) and molybdenum (Mo).

4. The system according to claim 1, wherein the first energy density melts the amorphous silicon layer to a first depth from a surface of the amorphous silicon layer that is equal to a first thickness of the amorphous silicon layer and the second energy density melts the amorphous silicon layer to a second depth from the surface of the amorphous silicon layer that is less than the first depth.

5. The system according to claim 1, wherein an energy density difference between the first and second energy densities is about 10 to 15 mJ/cm$^2$.

* * * * *